(12) United States Patent
Ueda et al.

(10) Patent No.: US 10,679,925 B2
(45) Date of Patent: Jun. 9, 2020

(54) ADHESIVE FOR SEMICONDUCTOR MOUNTING, AND SEMICONDUCTOR SENSOR

(71) Applicant: SEKISUI CHEMICAL CO., LTD., Osaka, Osaka (JP)

(72) Inventors: Saori Ueda, Kouka (JP); Yasuyuki Yamada, Kouka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/082,430

(22) PCT Filed: Mar. 10, 2017

(86) PCT No.: PCT/JP2017/009815
§ 371 (c)(1),
(2) Date: Sep. 5, 2018

(87) PCT Pub. No.: WO2017/155116
PCT Pub. Date: Sep. 14, 2017

(65) Prior Publication Data
US 2019/0088573 A1   Mar. 21, 2019

(30) Foreign Application Priority Data

Mar. 10, 2016   (JP) ................................ 2016-047173
Mar. 10, 2016   (JP) ................................ 2016-047174

(51) Int. Cl.
*H01L 23/482*   (2006.01)
*C09J 183/04*   (2006.01)
(Continued)

(52) U.S. Cl.
CPC ............ *H01L 23/4828* (2013.01); *C09J 9/02* (2013.01); *C09J 11/00* (2013.01); *C09J 11/08* (2013.01);
(Continued)

(58) Field of Classification Search
None
See application file for complete search history.

(56) References Cited

U.S. PATENT DOCUMENTS 5,483,106 A    1/1996  Echigo et al.
2009/0050266 A1   2/2009  Yang
(Continued)

FOREIGN PATENT DOCUMENTS

CN    1900195 A    1/2007
CN    1962798 A    5/2007
(Continued)

OTHER PUBLICATIONS

International Search Report for the Application No. PCT/JP2017/009815 dated Apr. 11, 2017.
(Continued)

*Primary Examiner* — Long Pham
(74) *Attorney, Agent, or Firm* — Cheng Law Group, PLLC

(57) ABSTRACT

Provided is an adhesive for semiconductor mounting that can achieve high-precision gap control and can increase heat resistance when a semiconductor is mounted. An adhesive for semiconductor mounting according to the present invention is an adhesive that is used for mounting a semiconductor, and contains a silicone resin and a spacer, the content of the spacer being 0.1% by weight or more and 5% by weight or less in 100% by weight of the adhesive, the 10% compressive elasticity modulus of the spacer being 5000 N/mm$^2$ or more and 15000 N/mm$^2$ or less, and the average particle diameter of the spacer being 10 μm or more and 200 μm or less.

10 Claims, 1 Drawing Sheet

(51) Int. Cl.
*H01L 29/84* (2006.01)
*C09J 11/00* (2006.01)
*G01L 9/00* (2006.01)
*H01L 23/00* (2006.01)
*C09J 171/02* (2006.01)
*C09J 11/08* (2006.01)
*C09J 9/02* (2006.01)
*H01L 21/52* (2006.01)
*H01L 23/31* (2006.01)
*C08G 65/336* (2006.01)

(52) U.S. Cl.
CPC .......... *C09J 171/02* (2013.01); *C09J 183/04* (2013.01); *G01L 9/00* (2013.01); *H01L 21/52* (2013.01); *H01L 23/3114* (2013.01); *H01L 24/29* (2013.01); *H01L 24/73* (2013.01); *H01L 29/84* (2013.01); *C08G 65/336* (2013.01); *C09J 2203/326* (2013.01); *H01L 24/32* (2013.01); *H01L 24/83* (2013.01); *H01L 2224/04026* (2013.01); *H01L 2224/0568* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05684* (2013.01); *H01L 2224/2612* (2013.01); *H01L 2224/2929* (2013.01); *H01L 2224/2939* (2013.01); *H01L 2224/32145* (2013.01); *H01L 2224/32225* (2013.01); *H01L 2224/83138* (2013.01); *H01L 2224/83855* (2013.01)

(56) References Cited

U.S. PATENT DOCUMENTS

| | | |
|---|---|---|
| 2009/0263936 A1 | 10/2009 | Fujisawa et al. |
| 2010/0277884 A1 | 11/2010 | Arifuku et al. |
| 2012/0085579 A1 | 4/2012 | Tatsuzawa et al. |
| 2014/0120356 A1 | 5/2014 | Shearer et al. |

FOREIGN PATENT DOCUMENTS

| | | |
|---|---|---|
| CN | 102161866 A | 8/2011 |
| CN | 102206480 A | 10/2011 |
| CN | 102533170 A | 7/2012 |
| CN | 103205231 A | 7/2013 |
| JP | 7-45642 A | 2/1995 |
| JP | 10-300772 A | 11/1998 |
| JP | 11-108782 A | 4/1999 |
| JP | 2007-322160 A | 12/2007 |
| JP | 2009-158712 A | 7/2009 |
| JP | 2011-174803 A | 9/2011 |
| JP | 2011-198953 A | 10/2011 |
| JP | 2012-4224 A | 1/2012 |
| JP | 2012-60020 A | 3/2012 |
| JP | 2015-75422 A | 4/2015 |

OTHER PUBLICATIONS

Written Opinion of the International Searching Authority (PCT/ISA/237) for Application No. PCT/JP2017/009815 dated Apr. 11, 2017.

International Search Report for the Application No. PCT/JP2017/009816 dated Apr. 11, 2017.

Written Opinion of the International Searching Authority (PCT/ISA/237) for Application No. PCT/JP2017/009816 dated Apr. 11, 2017.

Written Opinion of the International Searching Authority (PCT/ISA/237) for Application No. PCT/JP2017/009815 dated Apr. 11, 2017 (English Translation dated Sep. 20, 2018).

Written Opinion of the International Searching Authority (PCT/ISA/237) for Application No. PCT/JP2017/009816 dated Apr. 11, 2017 (English Translation dated Sep. 20, 2018).

Supplementary European Search Report for the Application No. EP 17 763 448.2 dated Aug. 27, 2019.

Supplementary European Search Report for the Application No. EP 17 763 449.0 dated Aug. 27, 2019.

The First Office Action for the Application No. 201780003503.6 from The State Intellectual Property Office of the People's Republic of China dated Nov. 27, 2019.

The First Office Action for the Application No. 201780003507.4 from The State Intellectual Property Office of the People's Republic of China dated Nov. 27, 2019.

ADHESIVE FOR SEMICONDUCTOR MOUNTING, AND SEMICONDUCTOR SENSOR

TECHNICAL FIELD

The present invention relates to an adhesive for semiconductor mounting that is used for mounting a semiconductor. The present invention also relates to a semiconductor sensor including the adhesive.

BACKGROUND ART

In recent years, an adhesive for bonding a semiconductor device to a substrate has been required to have heat resistance for accepting, for example, high output of the semiconductor device, and an adhesive containing a silicone resin has been proposed. Particularly a pressure sensor in the semiconductor device requires the adhesive to have performance of horizontally bonding a sensor chip to the substrate, as well as the heat resistance, and therefore an adhesive is used that contains, in addition to a silicone resin, a spacer. A sensor device including such an adhesive is disclosed in, for example, Patent Document 1.

Patent Document 1 discloses a sensor device including a first adhesive that is formed of a silicone-based resin and holds a fixed distance between a package and a circuit chip, and a second adhesive that is formed of a silicone-based resin and bonds the package to the circuit chip. The first adhesive functions as a spacer.

RELATED ART DOCUMENT

Patent Document

Patent Document 1: JP 2011-174803 A

SUMMARY OF THE INVENTION

Problems to be Solved by the Invention

The adhesive described in Patent Document 1 cannot sometimes give a sufficient gap control effect because the first adhesive (spacer) formed of a silicone-based resin is too soft to horizontally bond a chip to a substrate.

Further, the adhesive described in Patent Document 1 is sometimes low in heat resistance.

An object of the present invention is to provide an adhesive for semiconductor mounting that can achieve high-precision gap control and can increase heat resistance when a semiconductor is mounted. Another object of the present invention is to provide a semiconductor sensor including the adhesive.

Means for Solving the Problems

According to a broad aspect of the present invention, there can be provided an adhesive for semiconductor mounting (hereinafter, sometimes indicated as an adhesive) that is an adhesive used for mounting a semiconductor and contains a silicone resin and a spacer, the content of the spacer being 0.1% by weight or more and 5% by weight or less in 100% by weight of the adhesive, the 10% compressive elasticity modulus of the spacer being 5000 N/mm$^2$ or more and 15000 N/mm$^2$ or less, and the average particle diameter of the spacer being 10 μm or more and 200 μm or less.

In a specific aspect of the adhesive according to the present invention, when the spacer is subjected to heating at 150° C. for 1000 hours, the ratio of the 10% compressive elasticity modulus of the spacer after the heating to the 10% compressive elasticity modulus of the spacer before the heating is 0.95 or more and 1.05 or less.

In a specific aspect of the adhesive according to the present invention, the spacer contained in the adhesive includes no spacer particles having an average particle diameter of 1.5 times or more the average particle diameter of the spacer, or includes, in all 100% spacer particles, 0.1% or less of spacer particles having an average particle diameter of 1.5 times or more the average particle diameter of the spacer.

In a specific aspect of the adhesive according to the present invention, the specific gravity of the spacer is 1.05 or more and less than 1.30.

In a specific aspect of the adhesive according to the present invention, the compression recovery rate of the spacer is 50% or more.

In a specific aspect of the adhesive according to the present invention, the spacer is a copolymer of a polymerization component including divinylbenzene.

In a specific aspect of the adhesive according to the present invention, the spacer is a copolymer of a polymerization component including a (meth)acrylic compound, and the (meth)acrylic compound includes a (meth)acrylic compound having four or more (meth)acryloyl groups.

In a specific aspect of the adhesive according to the present invention, the spacer is a polymer of a polymerization component and the polymerizable group residual rate of the spacer is less than 1%.

In a specific aspect of the adhesive according to the present invention, the adhesive for semiconductor mounting is an adhesive for mounting of a semiconductor sensor chip that is used for mounting a semiconductor sensor chip.

According to a broad aspect of the present invention, there can be provided a semiconductor sensor including a first member, a semiconductor as a second member, and an adhesive layer that bonds the first member to the second member, the adhesive layer being a cured product of the adhesive for semiconductor mounting.

Effects of the Invention

An adhesive for semiconductor mounting according to the present invention contains a silicone resin and a spacer, the content of the spacer is 0.1% by weight or more and 5% by weight or less in 100% by weight of the adhesive, the 10% compressive elasticity modulus of the spacer is 5000 N/mm$^2$ or more and 15000 N/mm$^2$ or less, and the average particle diameter of the spacer is 10 μm or more and 200 μm or less. Thus, the adhesive for semiconductor mounting can achieve high-precision gap control and can increase heat resistance when a semiconductor is mounted.

MODES FOR CARRYING OUT THE INVENTION

Figure 1:
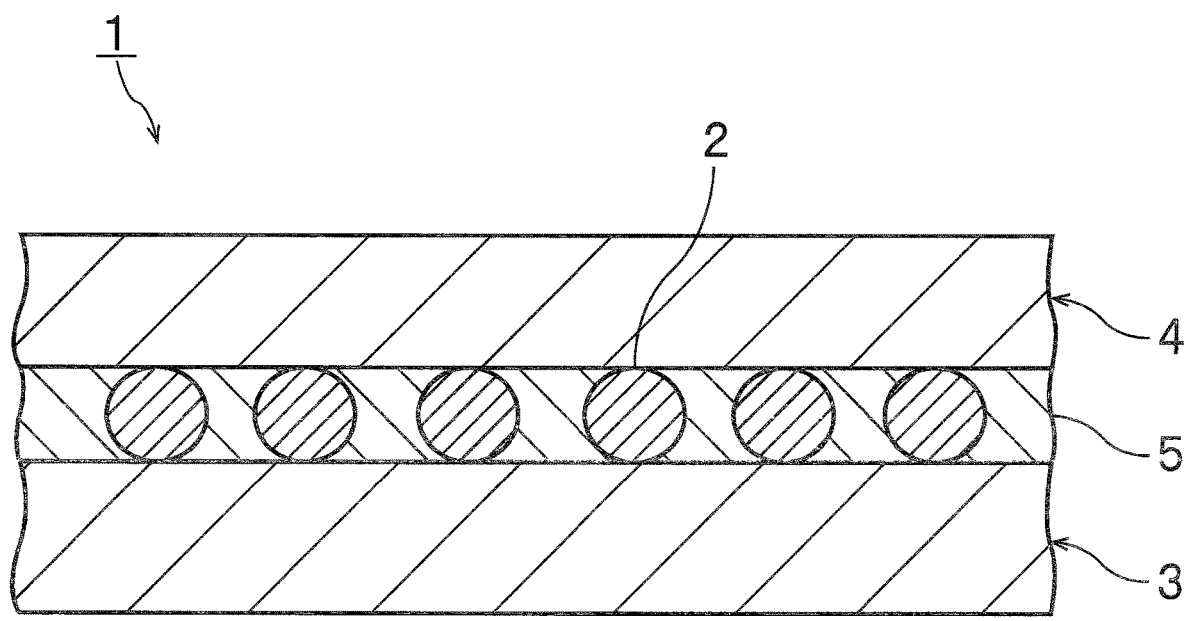
FIG. 1 is a sectional view showing one example of a semiconductor sensor including an adhesive for semiconductor mounting according to the present invention.

Hereinafter, the present invention is described in detail.

[Adhesive for Semiconductor Mounting]

An adhesive for semiconductor mounting according to the present invention (hereinafter, sometimes indicated as an adhesive) is an adhesive used for mounting a semiconductor. The adhesive according to the present invention contains a silicone resin and a spacer.

The content of the spacer contained in the adhesive according to the present invention is 0.1% by weight or more and 5% by weight or less in 100% by weight of the adhesive.

The 10% compressive elasticity modulus of the spacer is 5000 N/mm² or more and 15000 N/mm² or less. The average particle diameter of the spacer is 10 μm or more and 200 μm or less.

In the present invention, the adhesive can have the specifications described above to achieve high-precision gap control and increase heat resistance in the mounting of a semiconductor. For example, the adhesive enables more horizontal adhesion of a semiconductor chip. In addition, the adhesive can increase, as the heat resistance, adhesion strength at a high temperature.

For sufficiently increasing a gap control effect, the content of the spacer is 0.1% by weight or more and 5% by weight or less in 100% by weight of the adhesive. For further increasing the gap control effect, the content of the spacer is, in 100% by weight of the adhesive, preferably 0.5% by weight or more, more preferably 1% by weight or more and preferably 4% by weight or less, more preferably 3% by weight or less.

The 10% compressive elasticity modulus is a compressive elasticity modulus when the spacer is compressed by 10%. For sufficiently increasing the gap control effect, the 10% compressive elasticity modulus of the spacer is 5000 N/mm² or more and 15000 N/mm² or less. For further increasing the gap control effect, the 10% compressive elasticity modulus of the spacer is preferably 5500 N/mm² or more, more preferably 6000 N/mm² or more and preferably 10000 N/mm² or less, more preferably 8000 N/mm² or less.

The 10% compressive elasticity modulus of the spacer can be measured as follows.

The spacer is compressed with a smooth flat end surface of a cylindrical indenter (diameter 50 μm, made of diamond) of a micro compression testing machine under the loading conditions of 25° C. and a maximum test load of 20 mN for 60 seconds. In the measurement, a load value (N) and a compressive displacement (mm) are measured. From the measured values obtained, the compressive elasticity modulus can be derived from the following equation. As the micro compression testing machine, there can be used, for example, "Fischerscope H100" manufactured by HELMUT FISCHER GMBH.

$$10\% \text{ compressive elasticity modulus (N/mm}^2) = (3/2^{1/2}) \cdot S \cdot F^{-3/2} \cdot R^{-1/2}$$

F: load value (N) when spacer is deformed through Compression by 10%

S: compressive displacement (mm) when spacer is deformed through compression by 10%

R: radius (mm) of spacer

The average particle diameter of the spacer is 10 μm or more and 200 μm or less. For further increasing the gap control effect, the average particle diameter of the spacer is preferably 20 μm or more, more preferably 30 μm or more and preferably 150 μm or less, more preferably 110 μm or less, further preferably 100 μm or less.

The average particle diameter is derived by observing the spacer with a scanning electron microscope and arithmetically averaging the maximum diameters of any 50 spacer particles selected in the image observed.

For further increasing the heat resistance and further suppressing continuous thermal degradation, when the spacer is subjected to heating at 150° C. for 1000 hours, the ratio of the 10% compressive elasticity modulus of the spacer after the heating to the 10% compressive elasticity modulus of the spacer before the heating (10% compressive elasticity modulus of spacer after heating/10% compressive elasticity modulus of spacer before heating) is preferably 0.95 or more, more preferably 0.98 or more and preferably 1.05 or less, more preferably 1.02 or less.

For further increasing the gap control effect, the spacer contained in the adhesive preferably includes no spacer particles having an average particle diameter of 1.5 times or more the average particle diameter of the spacer. Alternatively, when the spacer contained in the adhesive includes spacer particles having an average particle diameter of 1.5 times or more the average particle diameter of the spacer, the spacer includes, in all 100% spacer particles, preferably 0.1% or less of spacer particles, more preferably 0.05% or less of spacer particles having an average particle diameter of 1.5 times or more the average particle diameter of the spacer, for further increasing the gap control effect.

For further increasing the gap control effect and further increasing dispersibility, the specific gravity of the spacer is preferably 1.05 or more, more preferably 1.10 or more and preferably less than 1.30, more preferably less than 1.25. For further increasing the gap control effect and further increasing the dispersibility, the difference is preferably 0.5 or less between the specific gravity of the adhesive that excludes the spacer and has been cured and the specific gravity of the spacer.

For further increasing the gap control effect, the compression recovery rate of the spacer is preferably 50% or more, more preferably 60% or more. No upper limitation is particularly set for the compression recovery rate of the spacer. The compression recovery rate of the spacer may be 100% or less.

The compression recovery rate of the spacer can be measured as follows.

The spacer is sprayed on a sample stand. A load (reverse load value) is applied to one sprayed spacer particle toward the center of the spacer particle with a micro compression testing machine so that the spacer particle is deformed through compression by 30%. Subsequently, the load is released to an initial load value (0.40 mN). Loads-compressive displacements during this procedure are measured, and the compression recovery rate can be derived from the following equation. The loading rate is set to 0.33 mN/sec. As the micro compression testing machine, there can be used, for example, "Fischerscope H100" manufactured by HELMUT FISCHER GMBH.

$$\text{Compression recovery rate (\%)} = [(L1-L2)/L1] \times 100$$

L1: compressive displacement of spacer particle from initial load value to reverse load value when load is applied L2: load release displacement of spacer particle from reverse load value to initial load value when load is released For further increasing the gap control effect and further increasing the heat resistance, the spacer is preferably a polymer of a polymerization component.

The polymerization component is a component that can be polymerized. The polymerization component preferably includes a polymerizable monomer having an ethylenic unsaturated group.

Examples of the polymerizable monomer having an ethylenic unsaturated group include a non-crosslinkable monomer and a crosslinkable monomer.

Examples of the non-crosslinkable monomer include, as vinyl compounds, styrene monomers such as styrene, α-methylstyrene, and chlorostyrene; vinyl ether compounds such as methyl vinyl ether, ethyl vinyl ether, propyl vinyl ether, 1,4-butanediol divinyl ether, cyclohexane dimethanol divinyl ether, and diethylene glycol divinyl ether; acid vinyl ester compounds such as vinyl acetate, vinyl butyrate, vinyl laurate, and vinyl stearate; and halogen-containing monomers such as vinyl chloride and vinyl fluoride, include, as (meth)acrylic compounds, alkyl (meth)acrylate compounds such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth) acrylate; oxygen atom-containing (meth)acrylate compounds such as 2-hydroxyethyl (meth) acrylate, glycerol (meth) acrylate, polyoxyethylene (meth)acrylate, and glycidyl (meth)acrylate; nitrile-containing monomers such as (meth)acrylonitrile; and halogen-containing (meth)acrylate compounds such as trifluoromethyl (meth)acrylate and pentafluoroethyl (meth)acrylate, include, as α-olefin compounds, olefin compounds such as diisobutylene, isobutylene, linealene, ethylene, and propylene, and include, as conjugated diene compounds, isoprene and butadiene.

Examples of the crosslinkable monomer include, as vinyl compounds, vinyl monomers such as divinylbenzene, 1,4-divinyloxybutane, and divinylsulfone, include, as (meth)acrylic compounds, polyfunctional (meth)acrylate compounds such as tetramethylolmethane tetra(meth)acrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, (poly)ethylene glycol di(meth)acrylate, (poly)propylene glycol di(meth)acrylate, (poly)tetramethylene glycol di(meth)acrylate, and 1,4-butanediol di(meth)acrylate, include, as allyl compounds, triallyl (iso)cyanurate, triallyl trimellitate, diallyl phthalate, diallyl acrylamide, and diallyl ether, include, as silicone compounds, silane alkoxide compounds such as tetramethoxysilane, tetraethoxysilane, methyltrimethoxysilane, methyltriethoxysilane, ethyltrimethoxysilane, ethyltriethoxysilane, isopropyltrimethoxysilane, isobutyltrimethoxysilane, cyclohexyltrimethoxysilane, n-hexyltrimethoxysilane, n-octyltriethoxysilane, n-decyltrimethoxysilane, phenyltrimethoxysilane, dimethyldimethoxysilane, dimethyldiethoxysilane, diisopropyldimethoxysilane, trimethoxysilylstyrene, γ-(meth)acryloxypropyltrimethoxysilane, 1,3-divinyltetramethyldisiloxane, methylphenyldimethoxysilane, and diphenyldimethoxysilane; polymerizable double bond-containing silane alkoxides such as vinyltrimethoxysilane, vinyltriethoxysilane, dimethoxymethylvinylsilane, dimethoxyethylvinylsilane, diethoxymethylvinylsilane, diethoxyethylvinylsilane, ethylmethyldivinylsilane, methylvinyldimethoxysilane, ethylvinyldimethoxysilane, methylvinyldiethoxysilane, ethylvinyldiethoxysilane, p-styryltrimethoxysilane, 3-methacryloxypropylmethyldimethoxysilane, 3-methacryloxypropyldimethoxysilane, 3-methacryloxypropylmethyldiethoxysilane, 3-methacryloxypropyltriethoxysilane, and 3-acryloxypropyltrimethoxysilane; cyclic siloxanes such as decamethylcyclopentasiloxane; modified (reactive) silicone oils such as a one terminal-modified silicone oil, a both terminal silicone oil, and a side chain silicone oil; and carboxyl group-containing monomers such as (meth)acrylic acid, maleic acid, and maleic anhydride.

The term "(meth)acrylate" denotes an acrylate and a methacrylate. The term "(meth)acrylic" denotes acrylic and methacrylic. The term "(meth)acryloyl" denotes acryloyl and methacryloyl.

For further increasing the gap control effect and further increasing the heat resistance, the polymerization component preferably includes a vinyl compound or a (meth)acrylic compound.

For further increasing the gap control effect and further increasing the heat resistance, the spacer is preferably a copolymer of a polymerization component including divinylbenzene. For further increasing the gap control effect and further increasing the heat resistance, the spacer is preferably a copolymer of a polymerization component including a (meth)acrylic compound, the (meth)acrylic compound including a (meth)acrylic compound having four or more (meth)acryloyl groups.

Examples of the (meth)acrylic compound having four or more (meth)acryloyl groups include dipentaerythritol penta(meth)acrylate, dipentaerythritol hexa(meth)acrylate, ditrimethylolpropane tetra(meth)acrylate, pentaerythritol tetra(meth)acrylate, and tetramethylolmethane tetra(meth)acrylate.

For further increasing the heat resistance, the polymerizable group residual rate of the spacer is preferably less than 1%, more preferably less than 0.5%.

The polymerizable group residual rate of the spacer can be measured as follows.

The spacer in an amount of 0.4 g is charged into a 8 mm rotor for solids of a nuclear magnetic resonance apparatus, and then measurement of $^{13}C$ is performed according to a Single Pulse (DD/MAS) method (measurement conditions: MAS rotation rate 7 kHz, number of scans 1000 times). The polymerizable group residual rate is calculated from a peak attributed to a vinyl group in the DD/MAS spectrum obtained. As the nuclear magnetic resonance apparatus, there can be used, for example, "JNM-ECX400" manufactured by JEOL RESONANCE Inc.

The adhesive contains the spacer and the silicone resin that are described above. The spacer is preferably dispersed in the silicone resin and constitutes the adhesive. A semiconductor sensor requires, of an adhesive, high gapping performance and high heat resistance, so that the adhesive described above is suitably used for mounting a semiconductor sensor chip. A semiconductor sensor requires, of an adhesive, high gapping performance and high heat resistance, so that the adhesive described above is preferably an adhesive for mounting of a semiconductor sensor chip. The silicone resin preferably has fluidity. The silicone resin is preferably a paste. The paste includes a liquid.

The adhesive may be a one-pack type including, for example, a main agent and a curing agent that have been mixed in advance, or a two-pack type including a main agent and a curing agent that are separate from each other. The adhesive may be a condensation curing type or an addition curing type. The adhesive may be cured with use of a catalyst such as platinum or may be cured by heating or moisture.

The silicone resin is not particularly limited. The silicone resin may be an organopolysiloxane compound, and the organopolysiloxane may have a hydroxyl group or a vinyl group at a terminal. The silicone resin may be polypropyleneoxide having a methyldimethoxysilyl group.

The adhesive may contain, in addition to the silicone resin and the spacer, a vinyl resin, a thermoplastic resin, a curable resin, a thermoplastic block copolymer, an elastomer, and a solvent, for example. These components may be used singly or in combination of two or more components.

Examples of the vinyl resin include a vinyl acetate resin, an acrylic resin, and a styrene resin. Examples of the thermoplastic resin include a polyolefin resin, an ethylene-vinyl acetate copolymer, and a polyamide resin.

Examples of the curable resin include an epoxy resin, a urethane resin, a polyimide resin, and an unsaturated polyester resin. The curable resin may be a normal temperature curing resin, a thermosetting resin, a photo-curing resin, or a moisture curing resin. These curable resins may be used in combination with a curing agent. Examples of the thermoplastic block copolymer include a styrene-butadiene-styrene block copolymer, a styrene-isoprene-styrene block copolymer, a hydrogenated product of a styrene-butadiene-styrene block copolymer, and a hydrogenated product of a styrene-isoprene-styrene block copolymer. Examples of the elastomer include a styrene-butadiene copolymer rubber and an acrylonitrile-styrene block copolymer rubber.

Examples of the solvent include water and an organic solvent. An organic solvent is preferable for easy removal. Examples of the organic solvent include alcohol compounds such as ethanol, ketone compounds such as acetone, methyl ethyl ketone, and cyclohexanone, aromatic hydrocarbon compounds such as toluene, xylene, and tetramethylbenzene, glycol ether compounds such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and tripropylene glycol monomethyl ether, ester compounds such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate, and propylene carbonate, aliphatic hydrocarbon compounds such as octane and decane, and petroleum solvents such as petroleum ether and naphtha.

The adhesive may contain, in addition to the spacer and the silicone resin, a variety of additives such as a filler, an extender, a softener, a plasticizer, a polymerization catalyst, a curing catalyst, a coloring agent, an antioxidant, a thermal stabilizer, a light stabilizer, a UV absorber, a lubricant, an antistatic agent, and a flame retardant, for example.

As a method of dispersing the spacer in the silicone resin, a conventionally known dispersing method can be used, and the method is not particularly limited. Examples of the method of dispersing the spacer in the silicone resin include a method of adding the spacer into the silicone resin and then kneading the mixture with, for example, a planetary mixer for dispersion, a method of uniformly dispersing the spacer in water or an organic solvent with, for example, a homogenizer, then adding the water or organic solvent containing the spacer into the silicone resin, and kneading the mixture with, for example, a planetary mixer for dispersion, and a method of diluting the silicone resin with, for example, water or an organic solvent, then adding the spacer to the diluted silicone resin, and kneading the mixture with, for example, a planetary mixer for dispersion.

For further relieving an external impact and further preventing a crack and peeling, the content of the silicone resin is, in 100% by weight of the adhesive, preferably 70% by weight or more, more preferably 80% by weight or more and preferably 99% by weight or less, more preferably 95% by weight or less.

[Semiconductor Sensor]

A semiconductor sensor according to the present invention includes a first member, a semiconductor as a second member, and an adhesive layer that bonds the first member to the second member. In the semiconductor sensor according to the present invention, the adhesive layer is formed of a cured product of the adhesive described above. The second member as a semiconductor is preferably a semiconductor sensor chip.

FIG. 1 is a sectional view showing one example of a semiconductor sensor including the adhesive for semiconductor mounting according to the present invention.

A semiconductor sensor 1 shown in FIG. 1 includes a first member 3, a semiconductor sensor chip as a second member 4, and an adhesive layer 5 that bonds the first member 3 to the second member 4. The adhesive layer 5 is a cured product of an adhesive containing a spacer 2 and a silicone resin.

The spacer 2 is present between the first member 3 and the second member 4, so that the first member 3 is horizontally bonded to the second member 4 with a fixed interval (gap) between the members.

A method of manufacturing the semiconductor sensor is not particularly limited. As one example of the method of manufacturing the semiconductor sensor, there can be exemplified a method of disposing the adhesive between the first member and the second member to give a stacked body and then heating and pressurizing the stacked body.

Specific examples of the first member include electronic components such as a semiconductor chip, a capacitor, and a diode, and electronic components such as a circuit substrate, e.g., a printed substrate, a flexible printed substrate, a glass epoxy substrate, and a glass substrate. The first member is preferably an electronic component. The adhesive is preferably an adhesive for bonding an electronic component.

The semiconductor is preferably a sensor chip, more preferably a pressure sensor chip.

The first member may include a first electrode on a surface thereof. The second member may include a second electrode on a surface thereof. Examples of the electrodes provided on the members include metal electrodes such as a gold electrode, a nickel electrode, a tin electrode, an aluminum electrode, a copper electrode, a silver electrode, a titanium electrode, a molybdenum electrode, and a tungsten electrode. When the member is a flexible printed substrate, the electrode is preferably a gold electrode, a nickel electrode, a titanium electrode, a tin electrode, or a copper electrode. When the member is a glass substrate, the electrode is preferably an aluminum electrode, a titanium electrode, a copper electrode, a molybdenum electrode, or a tungsten electrode. When the electrode is an aluminum electrode, the electrode may be an electrode formed of only aluminum or an electrode obtained by stacking an aluminum layer on a surface of a metal oxide layer. As a material for the metal oxide layer, there can be exemplified indium oxide doped with a trivalent metal element and zinc oxide doped with a trivalent metal element. Examples of the trivalent metal element include Sn, Al, and Ga.

Hereinafter, the present invention is specifically described with reference to examples and comparative examples. The present invention is not limited to only the following examples.

(Preparation of Spacer 1)

A monomer mixed liquid was obtained by mixing and uniformly dissolving 500 g of tetramethylolmethane, 500 g of divinylbenzene, and 20 g of benzoyl peroxide. A 1% by weight aqueous solution of polyvinyl alcohol in an amount of 5 kg was prepared and charged into a reaction vessel. The monomer mixed liquid was further charged into this reaction vessel and stirred for 2 to 4 hours, to adjust the particle diameter of a liquid drop of the monomer mixed liquid so that a predetermined particle diameter was given. Subsequently, a reaction was performed in a nitrogen atmosphere at 85° C. for 10 hours to give a spacer 1. The spacer 1 obtained was washed with hot water several times and then subjected to classification operations. In the spacer 1 obtained, the average particle diameter was 19.8 µm and the CV value of the particle diameter was 3.5%.

(Preparation of Spacer 2) A monomer mixed liquid was obtained by mixing and uniformly dissolving 1000 g of divinylbenzene and 56 g of benzoyl peroxide. A 1% by weight aqueous solution of polyvinyl alcohol in an amount of 5 kg was prepared and charged into a reaction vessel. The monomer mixed liquid was further charged into this reaction vessel and stirred for 2 to 4 hours, to adjust the particle diameter of a liquid drop of the monomer mixed liquid so that a predetermined particle diameter was given. Subsequently, a reaction was performed in a nitrogen atmosphere at 90° C. for 10 hours to give a spacer 2. The spacer 2 obtained was washed with hot water several times and then subjected to classification operations. In the spacer 2 obtained, the average particle diameter was 20.1 µm and the CV value of the particle diameter was 3.2%.

(Preparation of Spacer 3)

A monomer mixed liquid was obtained by mixing and uniformly dissolving 800 g of divinylbenzene, 200 g of acrylonitrile, and 20 g of benzoyl peroxide. A 1% by weight aqueous solution of polyvinyl alcohol in an amount of 5 kg was prepared and charged into a reaction vessel. The monomer mixed liquid was further charged into this reaction vessel and stirred for 2 to 4 hours, to adjust the particle diameter of a liquid drop of the monomer mixed liquid so that a predetermined particle diameter was given. Subsequently, a reaction was performed in a nitrogen atmosphere at 140° C. for 6 hours to give a spacer 3. The spacer 3 obtained was washed with hot water several times and then subjected to classification operations. In the spacer 3 obtained, the average particle diameter was 20.5 µm and the CV value of the particle diameter was 2.9%.

(Preparation of Spacer 4)

A monomer mixed liquid was obtained by mixing 400 g of methyltrimethoxysilane and 1600 g of vinyltrimethoxysilane. The monomer mixed liquid in an amount of 1000 g was added into a mixed liquid containing 100 g of methanol and 30 kg of ion-exchanged water (adjusted with ammonia water to give a pH of 10.5) at 15° C. and reacted under stirring.

The monomer mixed liquid in an amount of 1000 g was added 48 hours after the first addition of the monomer mixed liquid. The reaction was performed for another 48 hours after the second addition of the monomer mixed liquid. Subsequently, the resultant product was washed with water and methanol several times and then dried under vacuum at 50° C. for 48 hours to give dried particles. The dried particles were fired in a nitrogen atmosphere at 375° C. for hours to give a spacer. The spacer obtained was subjected to classification operations to give a spacer 4. In the spacer 4 obtained, the average particle diameter was 19.0 µm and the CV value of the particle diameter was 4.7

(Preparation of Spacer A)

A monomer mixed liquid was obtained by mixing and uniformly dissolving 100 g of ethylene glycol dimethacrylate, 800 g of isobornyl acrylate, 100 g of cyclohexyl methacrylate, and 35 g of benzoyl peroxide. A 1% by weight aqueous solution of polyvinyl alcohol in an amount of 5 kg was prepared and charged into a reaction vessel. The monomer mixed liquid was further charged into this reaction vessel and stirred for 2 to 4 hours, to adjust the particle diameter of a liquid drop of the monomer mixed liquid so that a predetermined particle diameter was given. Subsequently, a reaction was performed in a nitrogen atmosphere at 90° C. for 9 hours to give a spacer A. The spacer A obtained was washed with hot water several times and then subjected to classification operations. In the spacer A obtained, the average particle diameter was 20.1 µm and the CV value of the particle diameter was 3.1%.

(Preparation of Spacer B)

Preparation of Silicone Particles:

A solution A was prepared by dissolving 0.5 parts by weight of tert-butyl-2-ethylperoxyhexanoate (polymerization initiator, "PERBUTYL O" manufactured by NOF CORPORATION) in 30 parts by weight of a both terminal acrylic silicone oil. Further, an aqueous solution B was prepared by mixing 150 parts by weight of ion-exchanged water, 0.8 parts by weight of a 40% by weight aqueous solution of triethanolamine lauryl sulfate (emulsifier), and 80 parts by weight of a 5% by weight aqueous solution of polyvinyl alcohol (degree of polymerization: about 2000, degree of saponification: 86.5 to 89 mol %, "GOHSENOL GH-20" manufactured by The Nippon Synthetic Chemical Industry Co., Ltd.). Into a separable flask installed in a hot bathtub, the solution A was charged and then the aqueous solution B was added. Subsequently, a Shirasu Porous Glass (SPG) membrane (pore average diameter of about 20 µm) was used to perform emulsification. Then, the emulsified product was heated to 85° C. and polymerization was performed for 9 hours. All the particles obtained through the polymerization were washed with water by centrifugation and then subjected to classification operations to give silicone particles.

Preparation of Spacer B:

Into a 500-ml separable flask installed in a hot bathtub were charged 6.5 parts by weight of the silicone particles obtained, 0.6 parts by weight of hexadecyltrimethylammonium bromide, 240 parts by weight of distilled water, and 120 parts by weight of methanol. The mixture was stirred at 40° C. for 1 hour, followed by addition of 3.0 parts by weight of divinylbenzene and 0.5 parts by weight of styrene, and the mixture was heated to 75° C. and stirred for 0.5 hours. Subsequently, 0.4 parts by weight of 2,2'-azobis(isobutyric acid) was added to the mixture and stirred for 8 hours for a reaction. All the particles obtained through the polymerization were washed with water by centrifugation to give a spacer B. In the spacer B obtained, the average particle diameter was 20.3 µm and the CV value of the particle diameter was 3.6%.

Example 1

(Preparation of Silicone Adhesive)

The spacer 1 was added to a one-component thermally curable silicone adhesive TSE322 (manufactured by Momentive Performance Materials Inc.) so that the content of the spacer 1 became 1% by weight in an adhesive to be obtained, and was stirred with a planetary mixer for uniform dispersion. Thus, a silicone adhesive was prepared.

(Preparation of Pressure Sensor Structure)

The silicone adhesive was charged into a syringe and applied to a printed substrate with use of a dispenser so that the thickness of the adhesive became 20 μm, and a pressure sensor chip was disposed on the applied adhesive and heated at 150° C. for 10 minutes for adhesive bonding to give a pressure sensor structure.

Example 2

A pressure sensor structure was obtained in the same manner as in Example 1 except that the spacer 2 was used in place of the spacer 1 in the preparation of the silicone adhesive.

Example 3

A pressure sensor structure was obtained in the same manner as in Example 1 except that in the preparation of the silicone adhesive, the spacer 3 was used in place of the spacer 1 and the spacer 3 was added to the silicone adhesive so that the content of the spacer 3 became 0.5% by weight in the adhesive to be obtained.

Example 4

A pressure sensor structure was obtained in the same manner as in Example 1 except that the spacer 3 was used in place of the spacer 1 in the preparation of the silicone adhesive.

Example 5

A pressure sensor structure was obtained in the same manner as in Example 1 except that in the preparation of the silicone adhesive, the spacer 3 was used in place of the spacer 1 and the spacer 3 was added to the silicone adhesive so that the content of the spacer 3 became 3% by weight in the adhesive to be obtained.

Example 6

A pressure sensor structure was obtained in the same manner as in Example 1 except that in the preparation of the silicone adhesive, the spacer 4 was used in place of the spacer 1 and the spacer 4 was added to the silicone adhesive so that the content of the spacer 4 became 2.5% by weight in the adhesive to be obtained.

Comparative Example 1

A pressure sensor structure was obtained in the same manner as in Example 1 except that in the preparation of the silicone adhesive, the spacer A was used in place of the spacer 1 and the spacer A was added to the silicone adhesive so that the content of the spacer A became 8% by weight in the adhesive to be obtained.

Comparative Example 2

A pressure sensor structure was obtained in the same manner as in Example 1 except that in the preparation of the silicone adhesive, the spacer B was used in place of the spacer 1 and the spacer B was added to the silicone adhesive so that the content of the spacer B became 10% by weight in the adhesive to be obtained.

(Evaluation)

(1) 10% Compressive Elasticity Modulus

The spacers were measured for the 10% compressive elasticity modulus by the method described above with use of "Fischerscope H100" manufactured by HELMUT FISCHER GMBH.

(2) Average Particle Diameter

The average particle diameter of each of the spacers was derived by observing the spacer with a scanning electron microscope (SEM) and arithmetically averaging the maximum particle diameters of any 50 spacer particles selected in the image observed.

(3) Compression Recovery Rate

The spacers were measured for the compression recovery rate by the method described above with use of "Fischerscope H100" manufactured by HELMUT FISCHER GMBH.

(4) Change with Heating and Time

The spacers were measured for the 10% compressive elasticity modulus after subjected to heating in the atmosphere at 150° C. for 1000 hours with use of "Fischerscope H100" manufactured by HELMUT FISCHER GMBH. The change of the spacers with heating and time was determined according to the following criteria.

[Criteria for Determining Change with Heating and Time]

○: The ratio of the 10% compressive elasticity modulus after the heating to the 10% compressive elasticity modulus before the heating is 0.95 or more and 1.05 or less.

Δ: The ratio of the 10% compressive elasticity modulus after the heating to the 10% compressive elasticity modulus before the heating is 0.9 or more and less than 0.95, or more than 1.05 and 1.10 or less.

×: The ratio of the 10% compressive elasticity modulus after the heating to the 10% compressive elasticity modulus before the heating is less than 0.9 or more than 1.10

(5) Gap Control Property

Each of the pressure sensor structures obtained was observed with a scanning electron microscope (SEM) and evaluated for the minimum thickness and the maximum thickness of the adhesive layer. The gap control property was determined according to the following criteria.

[Criteria for Determining Gap Control Property]

○○: The maximum thickness is less than 1.2 times the minimum thickness.

○: The maximum thickness is 1.2 times or more and less than 1.5 times the minimum thickness.

×: The maximum thickness is 1.5 times or more the minimum thickness.

(6) Heat Resistance: Connection Strength

The pressure sensor structures obtained were measured for shear strength at 260° C. The heat resistance: connection strength was determined from the shear strength.

[Criteria for Determining Heat Resistance: Connection Strength]

○○: The shear strength is 150 N/cm² or more.

○: The shear strength is 100 N/cm² or more and less than 150 N/cm².

×: The shear strength is less than 100 N/cm².

Table 1 below shows the results.

TABLE 1

| | Type of spacer | Content of spacer (% by weight) | 10% compressive elasticity modulus of spacer before heating (N/mm$^2$) | 10% compressive elasticity modulus of spacer after heating (N/mm$^2$) | Change of spacer with heating and time | Average particle diameter of spacer (μm) | Compression recovery rate of spacer (%) | Specific gravity of spacer | Gap control property | Heat resistance: connection strength |
|---|---|---|---|---|---|---|---|---|---|---|
| Example 1 | 1 | 1 | 5280 | 5650 | Δ | 19.8 | 60 | 1.19 | ○ | ○ |
| Example 2 | 2 | 1 | 5630 | 5660 | ○ | 20.1 | 61 | 1.11 | ○ | ○ |
| Example 3 | 3 | 0.5 | 6880 | 6890 | ○ | 20.5 | 81 | 1.26 | ○ | ○○ |
| Example 4 | 3 | 1 | 6880 | 6890 | ○ | 20.5 | 81 | 1.26 | ○○ | ○○ |
| Example 5 | 3 | 3 | 6880 | 6890 | ○ | 20.5 | 81 | 1.26 | ○○ | ○ |
| Example 6 | 4 | 2.5 | 7950 | 7690 | Δ | 19.0 | 85 | 1.45 | ○ | ○○ |
| Comparative Example 1 | A | 8 | 1600 | 1750 | Δ | 20.1 | 7 | 1.10 | x | ○ |
| Comparative Example 2 | B | 10 | 100 | 98 | ○ | 20.3 | 9 | 1.00 | x | ○○ |

EXPLANATION OF SYMBOLS

1: Semiconductor sensor
2: Spacer
3: First member
4: Second member (semiconductor sensor chip)
5: Adhesive layer

The invention claimed is:

1. An adhesive for semiconductor mounting that is an adhesive used for mounting a semiconductor and comprises a silicone resin and a spacer,
    a content of the spacer being 0.1% by weight or more and 5% by weight or less in 100% by weight of the adhesive,
    a 10% compressive elasticity modulus of the spacer being 5000 N/mm$^2$ or more and 15000 N/mm$^2$ or less, and
    an average particle diameter of the spacer being 10 μm or more and 200 μm or less.

2. The adhesive for semiconductor mounting according to claim 1, wherein when the spacer is subjected to heating at 150° C. for 1000 hours, a ratio of the 10% compressive elasticity modulus of the spacer after the heating to the 10% compressive elasticity modulus of the spacer before the heating is 0.95 or more and 1.05 or less.

3. The adhesive for semiconductor mounting according to claim 1, wherein the spacer contained in the adhesive includes no spacer particles having an average particle diameter of 1.5 times or more the average particle diameter of the spacer, or includes, in all 100% spacer particles, 0.1% or less of spacer particles having an average particle diameter of 1.5 times or more the average particle diameter of the spacer.

4. The adhesive for semiconductor mounting according to claim 1, wherein a specific gravity of the spacer is 1.05 or more and less than 1.30.

5. The adhesive for semiconductor mounting according to claim 1, wherein a compression recovery rate of the spacer is 50% or more.

6. The adhesive for semiconductor mounting according to claim 1, wherein the spacer is a copolymer of a polymerization component including divinylbenzene.

7. The adhesive for semiconductor mounting according to claim 1,
    wherein the spacer is a copolymer of a polymerization component including a (meth)acrylic compound, and
    the (meth)acrylic compound includes a (meth)acrylic compound having four or more (meth)acryloyl groups.

8. The adhesive for semiconductor mounting according to claim 6,
    wherein the spacer is a polymer of a polymerization component, and
    a polymerizable group residual rate of the spacer is less than 1%.

9. The adhesive for semiconductor mounting, according to claim 1, being an adhesive for mounting of a semiconductor sensor chip that is used to mount a semiconductor sensor chip.

10. A semiconductor sensor comprising:
    a first member;
    a second member, the second member being a semiconductor; and
    an adhesive layer that bonds the first member to the second member,
    the adhesive layer being a cured product of the adhesive for semiconductor mounting according to claim 1.

* * * * *